United States Patent
Klintberg et al.

(10) Patent No.: US 11,255,917 B2
(45) Date of Patent: Feb. 22, 2022

(54) METHOD AND SYSTEM FOR IMPROVING BATTERY CAPACITY ESTIMATIONS

(71) Applicant: Volvo Car Corporation, Gothenburg (SE)

(72) Inventors: Anton Klintberg, Gothenburg (SE); Torsten Wik, Gothenburg (SE); John Skötte, Gothenburg (SE); Marcus Hedegärd, Vastra Frolunda (SE); Louise Almquist, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 0 days.

(21) Appl. No.: 16/901,059

(22) Filed: Jun. 15, 2020

(65) Prior Publication Data
US 2020/0393514 A1   Dec. 17, 2020

(30) Foreign Application Priority Data
Jun. 17, 2019  (EP) .................................... 19180658

(51) Int. Cl.
*G01R 31/367* (2019.01)
*G01R 31/3842* (2019.01)
(Continued)

(52) U.S. Cl.
CPC ............ *G01R 31/367* (2019.01); *B60L 58/12* (2019.02); *G01R 31/3842* (2019.01); *H01M 10/48* (2013.01); *H01M 2220/20* (2013.01)

(58) Field of Classification Search
None
See application file for complete search history.

(56) References Cited

U.S. PATENT DOCUMENTS

| 9,843,069 B2 | 12/2017 | Marcicki et al. |
| 10,048,321 B2 | 8/2018 | Kuper et al. |

(Continued)

FOREIGN PATENT DOCUMENTS

| CN | 106597307 A | 4/2017 |
| JP | 2014174050 A | 9/2014 |
| WO | 2018190508 A1 | 10/2018 |

OTHER PUBLICATIONS

Nov. 19, 2019 European Search Report issued on International U.S. Appl. No. 19/180,658.

*Primary Examiner* — Roy Y Yi
(74) *Attorney, Agent, or Firm* — Clements Bernard Walker; Christopher L. Bernard

(57) ABSTRACT

A method for estimating a capacity of an electrical energy storage device with higher accuracy than what is provided in the prior art. The uncertainties in measured electrical current or voltage used in the estimation of the capacity of the electrical energy storage device are at least partly compensated for by using a bias compensated capacity estimator instead of the often-used prior art capacity estimator. The accuracy of the voltage and/or electric current sensor becomes of less importance which leads to that less complicated and less costly sensors may be used and to improve accuracy of the estimated energy storage capacity. The above advantages are obtained by providing a bias compensated capacity estimator that includes at least one bias term which is related to a deviation of an expected value of an original capacity estimator from a true capacity value.

19 Claims, 4 Drawing Sheets

(51) Int. Cl.
*B60L 58/12* (2019.01)
*H01M 10/48* (2006.01)

(56) References Cited

U.S. PATENT DOCUMENTS

| | | |
|---|---|---|
| 10,114,079 B2 | 10/2018 | Duan et al. |
| 2004/0158418 A1* | 8/2004 | Kato ................. G01R 31/3835 702/63 |
| 2014/0177145 A1 | 6/2014 | Kawahara et al. |
| 2015/0293183 A1 | 10/2015 | Tenmyo et al. |
| 2016/0054390 A1* | 2/2016 | Lin ..................... G01R 31/367 702/63 |
| 2017/0242079 A1 | 8/2017 | Duan et al. |

* cited by examiner

METHOD AND SYSTEM FOR IMPROVING BATTERY CAPACITY ESTIMATIONS

CROSS-REFERENCE TO RELATED APPLICATION

The present disclosure claims the benefit of priority of co-pending European Patent Application No. 19180658.7, filed on Jun. 17, 2019, and entitled "METHOD AND SYSTEM FOR IMPROVING BATTERY CAPACITY ESTIMATIONS," the contents of which are incorporated in full by reference herein.

TECHNICAL FIELD

The present disclosure generally relates to a method and a system for estimating a capacity of an electrical energy storage device.

BACKGROUND

Batteries are becoming increasingly important in the automotive industry with the development of electrically powered vehicles. The increasing use of electrical power pushes the development of methods for measuring and monitoring the battery characteristics more accurately. For example, it is desirable to monitor and display the state of charge of the battery since this can be considered an equivalent of the fuel gage for the battery. Naturally, it is of interest to the driver to know the remaining level of charge that can be used for propulsion, if the battery is used for providing propulsion power.

Another battery parameter that is of interest to monitor is the battery capacity, defined as the amount of electrical charge, for example the number of ampere-seconds, a fully charged battery can deliver. The battery capacity provides a measure of the health of the battery, i.e. to what extend the storage capability of the battery has degraded by for example aging.

It is of interest to accurately estimate the degradation so that the battery may be replaced in time before the propulsion range using the battery becomes too short, and to prevent that secondary failures occur due to erroneous estimations of the battery capacity.

A common way to estimate the battery capacity is to use a capacity estimator including a measure of the state of charge and the electrical current withdrawn from or charged into the battery. This method often includes measuring the voltage of the battery for estimating the state of charge which inevitably includes uncertainties in the measured voltage and thereby also the estimated state of charge.

Accordingly, there is therefore room for improvements in methods for estimating the capacity of batteries.

SUMMARY

The disclosed subject matter generally relates to a method for estimating a capacity of an electrical energy storage device with higher accuracy than what is provided in the prior art.

With the proposed method, the uncertainties in measured electrical current or voltage used in the estimation of the capacity of the electrical energy storage device are at least partly compensated for by using a bias compensated capacity estimator instead of the often-used prior art capacity estimator. Accordingly, with the herein proposed method, the accuracy of the voltage and/or electric current sensor becomes of less importance which leads to that less complicated and less costly sensors may be used. Further, the accuracy of the estimated energy storage capacity is improved compared to prior art methods.

The above advantages are obtained by providing a bias compensated capacity estimator. The bias compensated capacity estimator includes a subtraction between a capacity estimator which is based on a ratio between integrated electrical current and a variation in state of charge, and at least one bias term. The bias term is related to a deviation of an expected value of the capacity estimator from a true capacity value.

The inventors realized to use a common capacity estimator, and to derive the expected value of the capacity estimator. The expected value has several terms including the true value and a set of deviation terms e.g. variance terms, that are so-called bias-terms to the estimator. The inventors realized to subtract the bias terms derived from the expected value of the capacity estimator from the original capacity estimator, to form a bias compensated capacity estimator. In other words, the uncertainties from the measurement of electrical current and/or voltage that are reflected in the bias terms, are compensated for by subtracting the bias terms from the original capacity estimator.

The electrical energy storage device capacity is estimated using the bias compensated capacity estimator, integrated electrical current, and the variation in state of charge of the electrical energy storage device.

The inventors also propose a system for estimating a capacity of an electrical energy storage device, the system comprises an electrical current sensor configured to measure an electrical current of the electrical energy storage device, and processing circuitry configured to estimate a variation in state of charge of the electrical energy storage device, and to estimate the electrical energy storage device capacity based on an integration of the electrical current, the variation in state of charge, and a bias compensated capacity estimator including a subtraction between a capacity estimator based on a ratio between the discharge electrical current and the variation in state of charge, and at least one bias term related to a deviation of an expected value of the capacity estimator from a true capacity value.

Further features of, and advantages with, the present disclosure will become apparent when studying the appended claims and the following description. The skilled person realize that different features of the present disclosure may be combined to create embodiments other than those described in the following, without departing from the scope of the present disclosure.

BRIEF DESCRIPTION OF THE DRAWINGS

These and other aspects of the disclosed subject matter will now be described in more detail, with reference to the appended drawings showing example embodiments of the present disclosure, wherein.

DESCRIPTION OF EMBODIMENTS

Figure 1:
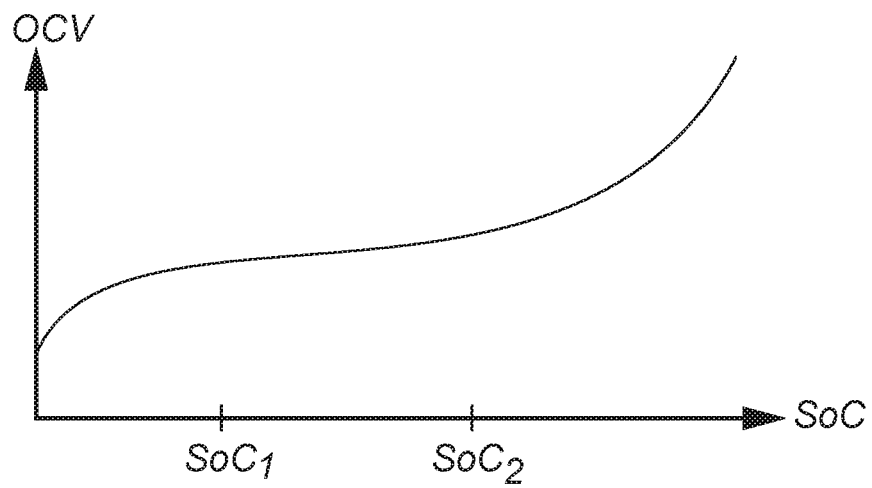
FIG. 1 illustrates a conceptual open circuit voltage versus state of charge curve.

In the present detailed description, various embodiments of a method and a system according to the present disclosure are described. However, embodiments of the present disclosure may be realized in many different forms and should not be construed as limited to the embodiments set forth herein; rather, these embodiments are provided for thoroughness and completeness, and to fully convey the scope of the disclosure to the skilled person. In some instances, well known structures and devices are shown in block diagram form in order to avoid obscuring the novelty of the exemplary embodiments presented herein. Like reference characters refer to like elements throughout.

FIG. 1 schematically illustrates a so-called open circuit voltage (OCV) curve, which reflects the OCV as a function of state of charge (SOC) of an electrical energy storage device, e.g. a battery cell. Generally, an electrical energy storage module may have a plurality of electrical energy storage cells to form a complete electrical energy storage module, e.g. a traction battery. The herein proposed method and system may be applied to individual cells or to the combination of two or more cells.

The OCV is the potential difference between the electrodes of an electrical energy storage device when it is at rest. Generally, an energy storage device is fully charged when the OCV is equal to a predefined maximum voltage. An energy storage device is fully discharged when the OCV is equal to a predefined minimum voltage.

Accordingly, the energy storage capacity is the number of ampere seconds that can be drawn from a fully charged energy storage device until it is fully discharged.

The SOC is a measure of the remaining level of charge in an energy storage device, and may be defined as the ratio between the remaining number of ampere seconds until the energy storage device is fully discharged, and the capacity of the energy storage device. The SOC can be calculated by integrating the electrical current through the energy storage device and normalizing with the capacity. In other words, the present SOC, $z_{SOC}(t)$ may be given by:

$$z_{SOC}(t) = z_{SOC}(t_0) + \frac{\eta_i}{Q}\int_{t_0}^{t} i(t)d\tau \tag{1}$$

Where t is the present time, $t_0$ is a prior time instant, $\eta_i$ is the Coulombic efficiency, and Q is the electrical energy capacity.

By measuring the OCV for different values of SOC, a mapping between OCV and SOC is obtained and one such example OCV-curve is shown in FIG. 1. From equation 1 it is realized that it is important to determine the capacity accurately to obtain an accurate estimate of the SOC. For example, a small error in the OCV in the relatively constant part of the OCV curve, from SOC1 and SOC2 will lead to a high uncertainty in the SOC estimated from the OCV-curve. The aim of the present disclosure is to mitigate the effect of this uncertainty.

Figure 2:
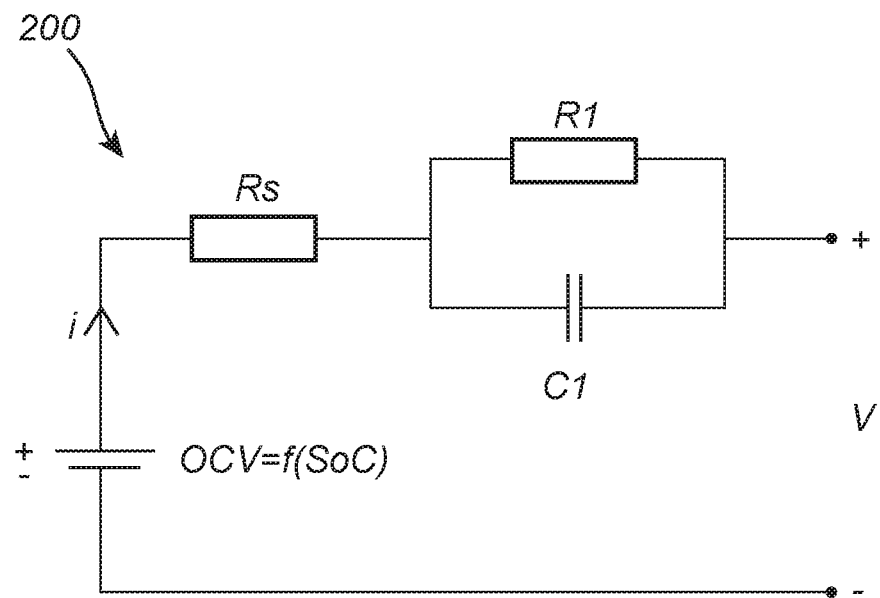
FIG. 2 illustrates an equivalent circuit model of an energy storage device.

The discussion of capacity estimators herein is based on the so-called equivalent circuit model of an electrical energy storage device. FIG. 2 schematically illustrates an equivalent circuit model 200, indicating an open circuit voltage (OCV) which is a function of the state of charge (SOC) of the electrical energy storage device. There is further a series resistance Rs, a polarization resistance R1 connected in parallel with a polarization capacitance C1, both which are connected in series with the series resistance Rs. The voltage V indicates the output voltage of the circuit 200, and the electrical current i is the electrical current through the circuit 200, e.g. a charge or discharge current.

Based on rearranging equation (1), the capacity Q may be expressed as:

$$Q = \frac{\eta_i \int_{t_0}^{t} i(\tau)d\tau}{z_{SOC}(t) - z_{SOC}(t_0)}, \tag{2}$$

where $z_{SOC}(t) \neq z_{SOC}(t_0)$. For practical purposes is the capacity estimator is used in discrete form:

$$\hat{Q} = \frac{\eta_i \Delta t \sum_{k=k_0}^{k_1} i_m(k)}{\hat{z}_{SOC}(k_1) - \hat{z}_{SOC}(k_0)} \tag{3}$$

where $\Delta t$ is the sampling time, $i_m$ is the measured electrical current, and $\hat{z}_{SOC}$ is estimated SOC.

Figure 3:
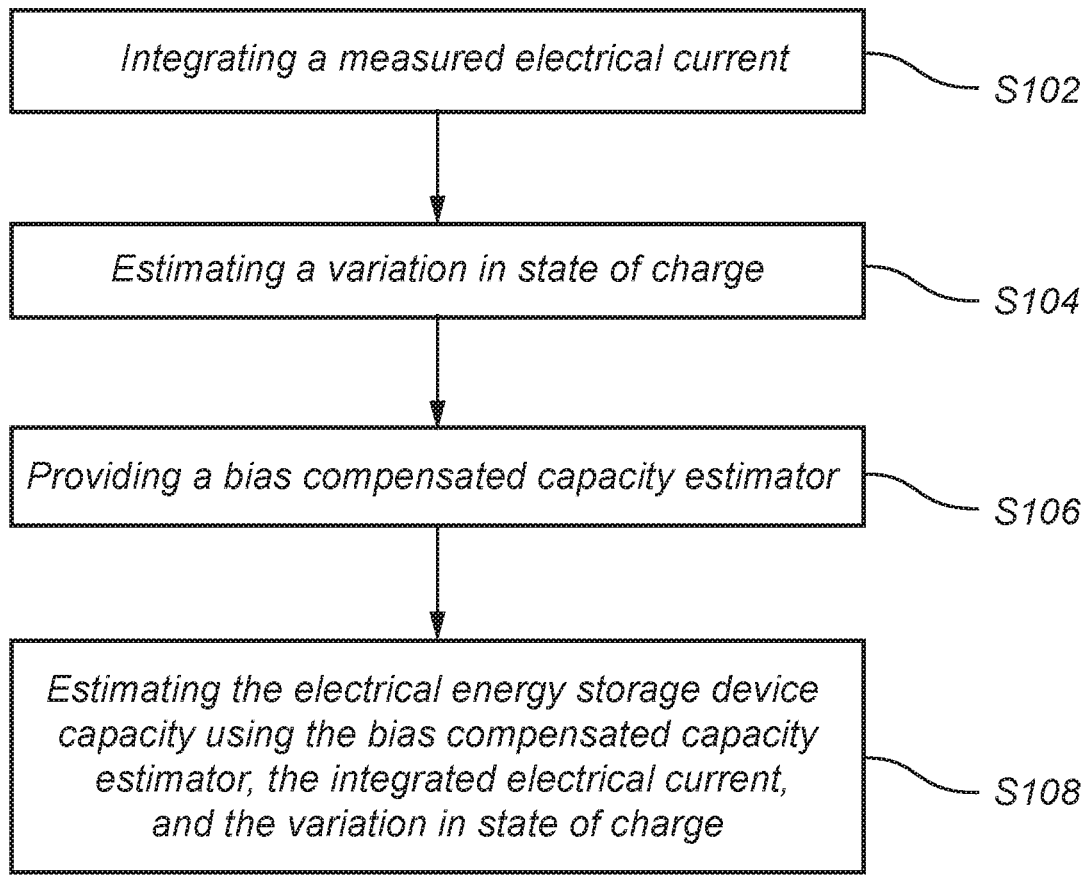
FIG. 3 is a flow-chart with method steps according to embodiments of the present disclosure.

FIG. 3 is a flow-chart of method steps for estimating a capacity of an electrical energy storage device according to embodiments of the present disclosure. The method comprises a step S102 of integrating, over time, a measured electrical current of the electrical energy storage device. This integration is practically implemented by the summation multiplied by the time step $\Delta t$ in the above equation (3). In step S104, estimating a variation in state of charge of the electrical energy storage device. This variation is represented by the term $\hat{z}_{SOC}(k_1) - \hat{z}_{SOC}(k_0)$ in equation (3). In step S106, providing a bias compensated capacity estimator including a subtraction between a capacity estimator based on a ratio between the integrated electrical current and the variation in state of charge, and at least one bias term related to a deviation of an expected value of the capacity estimator from a true capacity value. The capacity estimator is based on a ratio between the integrated electrical current and the variation in state of charge, and is preferably given by the capacity estimator $\hat{Q}$ in equation (3). The bias terms will be discussed in more detail below but generally relate to an estimated deviation from the expected value of the capacity estimator $\hat{Q}$ that causes a bias of the capacity estimator. In step S108, estimating the electrical energy storage device capacity using the bias compensated capacity estimator, the integrated electrical current, and the variation in state of charge.

Embodiments of the present disclosure are at least partly based on the realization to subtract the bias term from the capacity estimator to in this way remove the bias from the capacity estimator caused by e.g. inaccurate measurements of electrical current or voltage. It was realized that an expected value includes deviation terms that represent a bias on the true value. The bias terms may be derived and subtracted from the original capacity estimator to in this way remove the bias and therefore also the deviation from the true value.

The bias term may be the deviation of the expected value of the capacity estimator expressed as a random capacity estimator variable, from the true capacity value. Typically, a random variable has a mean value and a deviation, e.g. a standard deviation. The difference between the mean value and the true capacity value may represent the bias term in one embodiment.

However, for producing a more accurate bias compensated capacity estimator, the random capacity estimator variable may be based on a quotient of two normally distributed variables, where a first variable is an integrated electrical current variable and a second variable is a state of charge variation variable. This is more accurate when using the capacity estimator in equation (3) which is a quotient between the integrated electrical current variable and the state of charge variation variable.

Figure 4:
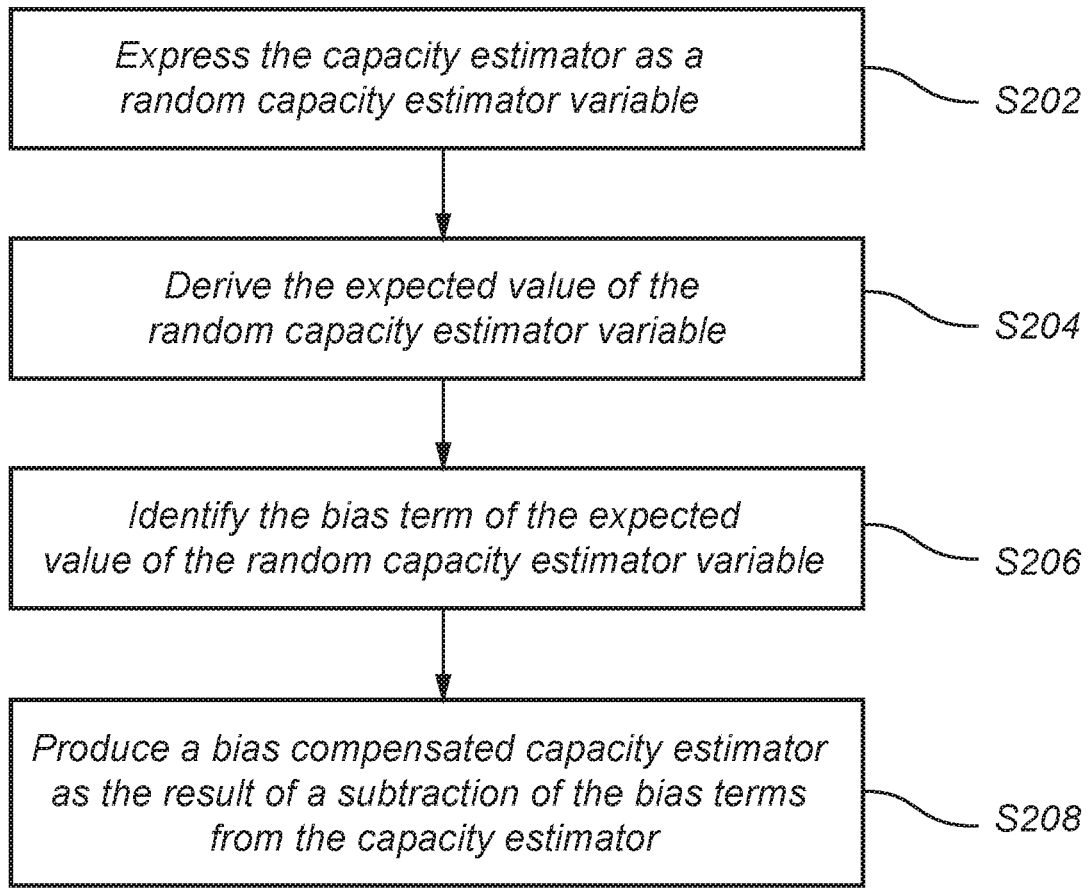
FIG. 4 is a flow-chart with method steps according to embodiments of the present disclosure.

One example way of constructing the bias compensated capacity estimator will now be described, with reference to the flow-chart in FIG. 4. In step S202, expressing the capacity estimator as a random capacity estimator variable being a ratio between a normal distributed integrated electrical current variable corrupted by gaussian current noise, and a normal distributed state of charge variable corrupted by gaussian state of charge noise. More specifically, the measured electrical current ($i_m(k)$) may be assumed to be unbiased but corrupted with Gaussian noise ($w(k)$), i.e. $i_m(k)=i(k)+w(k)$, where $w(k) \sim N(0,\sigma_I^2)$, i.e. normal distributed with zero mean and standard deviation $\sigma_I$. Similarly, the estimated SOC ($\hat{z}_{SOC}(k)$) is unbiased but corrupted with Gaussian noise ($v(k)$), $\hat{z}_{SOC}(k)=z_{SOC}(k)+v(k)$, where $v(k) \sim N(0,\sigma_{SOC}^2)$, i.e. normal distributed with zero mean and standard deviation $\sigma_{SOC}$.

With the above assumption, the capacity estimator may be expressed a random capacity variable in the form:

$$\hat{Q} = \frac{\eta_i \Delta t \left( \sum_{k=k_0}^{k_1} i(k) + \sum_{k=k_0}^{k_1} w(k) \right)}{\hat{z}_{SOC}(k_1) + v(k_1) - (\hat{z}_{SOC}(k_0) + v(k_0))}. \quad (4)$$

Equation (4) provides the random capacity estimator as a quotient of two normally distributed variables, where a first variable is an integrated electrical current variable and a second variable is a state of charge variation variable.

As is known in the art, (see for example Haya et al, management science 21 (11) (1975) 1338-1341), the expected value ($E[W]$, $W=Y/X$) of a quotient of two normally distributed variables, X and Y, may approximately be given by:

$$E[W] \approx \frac{\mu_Y}{\mu_X} + \frac{\sigma_X^2 \mu_Y}{\mu_X^3} - \frac{\rho_{XY} \sigma_X \sigma_Y}{\mu_X^2} \quad (5)$$

where $\rho_{XY}$ is the correlation between X and Y.

In step S204, deriving the expected value of the random capacity estimator variable.

Using equations (3) and (5), the expected value $E[\hat{Q}]$ of the capacity estimator $\hat{Q}$ may be given by:

$$E[\hat{Q}] \approx Q + \frac{\sigma_{SOC}^2 \eta_i \Delta t \sum_{k=k_0}^{k_1} i_m(k)}{(\hat{z}_{SOC}(k_1) - \hat{z}_{SOC}(k_0))^3} - \frac{\rho \sigma_{SOC} \sigma_I \sqrt{(k_1 - k_0)}}{(\hat{z}_{SOC}(k_1) - \hat{z}_{SOC}(k_0))^2} \quad (6)$$

Thus, equation (6) represent an approximation of the expected value of the capacity estimator, $\hat{Q}$. In equation (6), $\rho$ is the correlation between the numerator and denominator in equation (4).

Next, in step S206, identifying the bias terms of the expected value of the random capacity estimator variable. The bias terms are the terms following the true value Q and thereby representing the deviation from the true value Q, i.e. the bias terms in equation (6) are:

$$\text{Bias terms:} \quad \frac{\sigma_{SOC}^2 \eta_i \Delta t \sum_{k=k_0}^{k_1} i_m(k)}{(\hat{z}_{SOC}(k_1) - \hat{z}_{SOC}(k_0))^3} - \frac{\rho \sigma_{SOC} \sigma_I \sqrt{(k_1 - k_0)}}{(\hat{z}_{SOC}(k_1) - \hat{z}_{SOC}(k_0))^2}. \quad (7)$$

Next, in step S208, producing the bias compensated capacity estimator as the result of a subtraction of the bias terms from the capacity estimator. In other words, the bias compensated capacity estimator, $\hat{Q}_{bc}$, is now provided as:

$$\hat{Q}_{bc} = \hat{Q} - \frac{\sigma_{SOC}^2 \eta_i \Delta t \sum_{k=k_0}^{k_1} i_m(k)}{(\hat{z}_{SOC}(k_1) - \hat{z}_{SOC}(k_0))^3} + \frac{\rho \sigma_{SOC} \sigma_I \sqrt{(k_1 - k_0)}}{(\hat{z}_{SOC}(k_1) - \hat{z}_{SOC}(k_0))^2}, \quad (8)$$

where $\hat{Q}$ is given by equation (3). The expected value of the bias compensated capacity estimator, $\hat{Q}_{bc}$ is equal to Q. In other words, the expected value of the bias compensated capacity estimator is equal to the true value Q. Thus, the above steps construct a bias compensated capacity estimator which compensates for bias which means the provided bias compensated capacity estimator is more robust against measurements errors in the measured electrical current or voltage and may thereby provide more accurate estimates of the estimated capacity. Moreover, using the bias compensated capacity estimator may allow for simpler and less costly current and/or voltage sensors to be used as long as the variance of the sensor is known, e.g. to estimate $\sigma_{SOC}^2$. It should be noted that the bias compensated capacity estimator provided in equation (8) is valid regardless of how SOC is estimated. For example, the SOC may be determined by measuring the open circuit voltage of the electrical energy storage device, and estimating the variation in state of charge based on the open circuit voltage.

Furthermore, when the SoC is estimated from the OCV-curve, $\rho=0$ since the correlation between the measured electrical current and the SOC is then equal to zero, whereby the expression (8) is simplified by removing the last term including $\rho$.

The bias compensated capacity estimator is pre-constructed prior to measuring the electrical current that is integrated. In other words, the bias compensated capacity estimator is constructed and prepared prior to usage and is not re-constructed every cycle.

Figure 5:
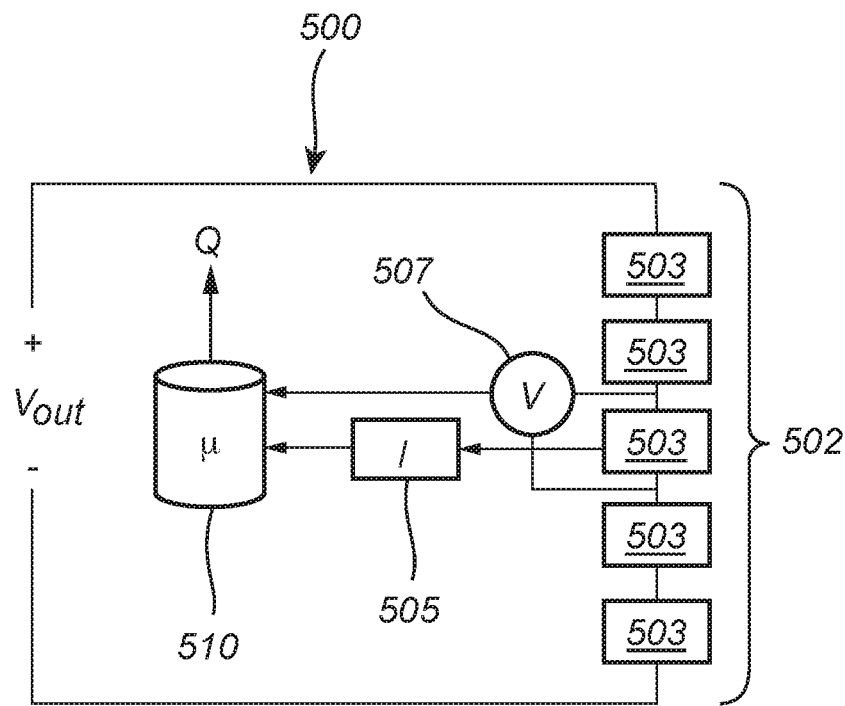
FIG. 5 is a box diagram of a system according to embodiments of the present disclosure.

FIG. 5 is a box diagram of a system 500 for estimating a capacity of an electrical energy storage module 502 comprising a plurality of energy storage devices 503. The electrical energy storage devices 503 may be a single energy storage cell, whereby the electrical energy storage module 502 includes a plurality of storage cells 503 electrically connected in series. Typically, the number of series connected cells is in the range of 50-800 cells depending on the output voltage $V_{out}$ that is desired. Furthermore, it is also possible to connect parallel connected cells in series in order to provide a larger capacity electrical energy storage device. In other words, an energy storage device 503 may include multiple energy storage cells connected in parallel.

The system 500 comprises an electrical current sensor 505 configured to measure an electrical current of the electrical energy storage device 503. The electrical current may be a charge current supplied to the energy storage device 503 or a discharge current withdrawn from the energy storage device 503. There may further be included a voltage sensor 507 for measuring the voltage of the electrical energy storage device 503 for estimating the SOC of the electrical energy storage device 503.

Processing circuitry 510 is communicatively connected to the electrical current sensor 505 and to the voltage sensor 507 such that it can receive data indicating the values of the measured electrical current and voltage from the sensor.

The processing circuitry 510, which may include one or more control units, and memory devices, is configured to estimate a variation in state of charge of the electrical energy storage device based on the received data.

Moreover, the processing circuitry 510 is configured to estimate the electrical energy storage device capacity based on an integration of the electrical current, the variation in state of charge, and a bias compensated capacity estimator. The bias compensated capacity estimator includes a subtraction between a capacity estimator based on a ratio between the discharge electrical current and the variation in state of charge, and at least one bias term related to a deviation of an expected value of the capacity estimator from a true capacity value.

The processing circuitry 510 outputs the estimated capacity Q.

FIG. 5 conceptually illustrates a single voltage sensor 507 and a single electrical current sensor 505 for measuring the voltage across one electrical energy storage device 503 and the electrical current through the electrical energy storage device 503. However, in practical implementations, there may be a voltage sensor and an electrical current sensor for each of the electrical energy storage devices 503 of the energy storage module 502. The processing circuitry may then receive data from all the voltage sensors and all the electrical current sensors and execute the capacity estimation for each of the electrical energy storage devices 503.

There is further provided a control unit configured to: receive data indicating an integrated measured electrical current of an electrical energy storage device, estimate a variation in state of charge of the electrical energy storage device, retrieve a bias compensated capacity estimator including a subtraction between a capacity estimator based on a ratio between the discharge electrical current and the variation in state of charge, and at least one bias term related to a deviation of an expected value of the capacity estimator from a true capacity value, and estimate the electrical energy storage capacity using the bias compensated capacity estimator, the integrated electrical current, and the variation in state of charge.

A representation of the bias compensated capacity estimator may be stored in a memory device and retrieved by the control unit from the memory storage device. The bias compensated capacity estimator is generally a function executed as an algorithm for estimating the capacity.

The control unit is preferably configured for employment in a vehicle comprising an electrical energy storage device.

The electrical energy storage device described herein may be a traction battery for an electric vehicle.

Figure 6:
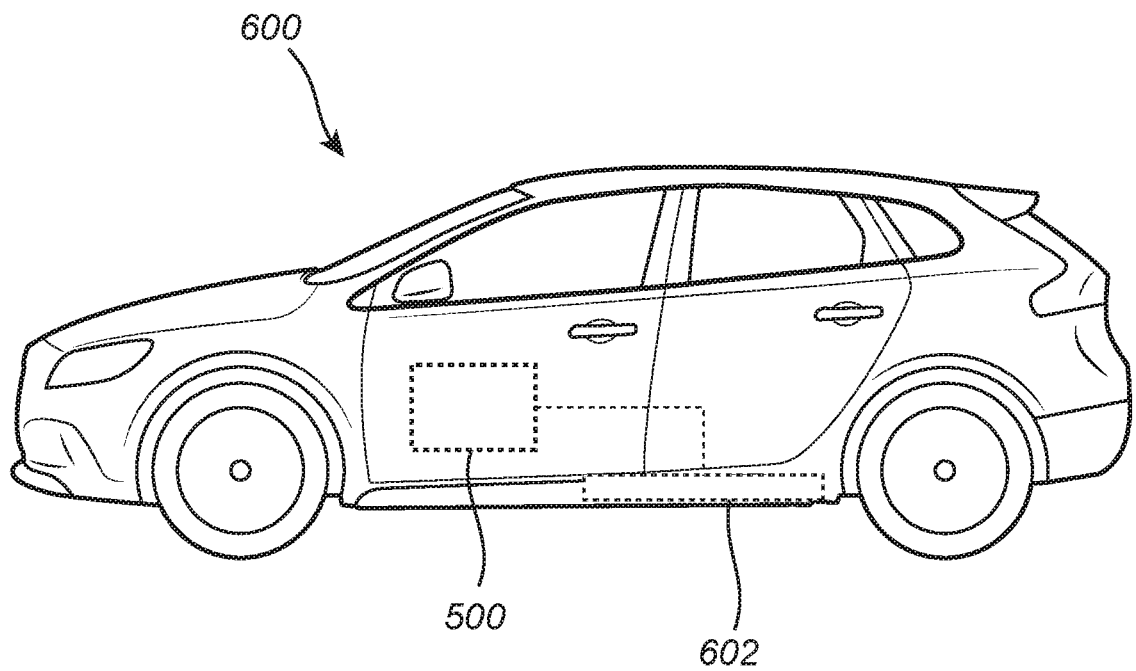
FIG. 6 illustrates a conceptual vehicle according to embodiments of the present disclosure.

FIG. 6 illustrates a vehicle 600 which may be an electric vehicle comprising an electrical energy storage device 602 such as a traction battery for providing propulsion power to the electric vehicle 600. The vehicle further comprises a system 500 as described with reference to FIG. 5.

In addition, there is provided a computer program product comprising a computer readable medium having stored thereon computer program means for estimating a capacity of an electrical energy storage device, wherein the computer program product comprises: code for estimating the electrical energy storage device capacity using a bias compensated capacity estimator, integrated measured electrical current, and an estimated variation in state of charge of the electrical energy storage device, the bias compensated capacity estimator includes a subtraction between a capacity estimator based on a ratio between integrated electrical current and a variation in state of charge, and at least one bias term related to a deviation of an expected value of the capacity estimator from a true capacity value.

The communication between the control unit and other devices, systems, or components may be hardwired or may use other known electrical connection techniques, or wireless networks, known in the art such as via CAN-buses, Bluetooth, Ethernet, Wifi, 3G, 4G, 5G, etc.

A control unit may include a microprocessor, microcontroller, programmable digital signal processor or another programmable device, as well as be embedded into the vehicle/power train control logic/hardware. The control unit may also, or instead, include an application-specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device. The control unit may comprise modules in either hardware or software, or partially in hardware or software and communicate using known transmission buses such as CAN-bus and/or wireless communication capabilities.

A control unit of the present disclosure is generally known as an ECU, electronic control unit.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable gate arrays (FPGAs), complex programmable logic devices (CPLDs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

The invention claimed is:

1. A method for estimating a capacity of an electrical energy storage device, comprising:
   integrating, over time, a measured electrical current of the electrical energy storage device,
   estimating a variation in state of charge of the electrical energy storage device,
   providing a bias compensated capacity estimator including a subtraction between a capacity estimator based on a ratio between the integrated electrical current and the variation in state of charge, and at least one bias term being a deviation of an expected value of the capacity estimator, expressed as a random capacity estimator variable, from a true capacity value, and
   estimating the electrical energy storage device capacity using the bias compensated capacity estimator, the integrated electrical current, and the variation in state of charge.

2. The method according to claim 1, wherein the random capacity estimator variable is a quotient of two normally distributed variables, a first variable is an integrated electrical current variable and a second variable is a state of charge variation variable.

3. The method according to claim 1, wherein the bias compensated capacity estimator is constructed by:
   expressing the capacity estimator as a random capacity estimator variable being a ratio between a normal distributed integrated electrical current variable corrupted by gaussian current noise, and a normal distributed state of charge variable corrupted by gaussian state of charge noise,
   deriving the expected value of the random capacity estimator variable,
   identifying the bias terms of the expected value of the random capacity estimator variable, and
   producing the bias compensated capacity estimator as the result of a subtraction of the bias terms from the capacity estimator.

4. The method according to claim 1, wherein the capacity estimator is a discrete capacity estimator.

5. The method according to claim 1, wherein the bias compensated capacity estimator is pre-constructed prior to measuring the electrical current that is integrated.

6. The method according to claim 1, wherein the electrical energy storage device is a battery cell.

7. The method according to claim 1, wherein the variation in state of charge is estimated from an open circuit voltage versus state of charge relation.

8. The method according to claim 1, comprising:
   measuring the open circuit voltage of the electrical energy storage device at two time instances, and
   estimating the variation in state of charge based on the open circuit voltages.

9. The method according to claim 1, wherein the electrical energy storage device is a traction battery for an electric vehicle.

10. A control unit configured to:
    receive data indicating an integrated measured electrical current of an electrical energy storage device,
    estimate a variation in state of charge of the electrical energy storage device,
    retrieve a bias compensated capacity estimator including a subtraction between a capacity estimator based on a ratio between the discharge electrical current and the variation in state of charge, and at least one bias term being a deviation of an expected value of the capacity estimator, expressed as a random capacity estimator variable, from a true capacity value, and
    estimate the electrical energy storage capacity using the bias compensated capacity estimator, the integrated electrical current, and the variation in state of charge.

11. The control unit according to claim 10, configured to construct the bias compensated capacity estimator by:
- expressing the capacity estimator as the random capacity estimator variable being a ratio between a normal distributed integrated electrical current variable corrupted by gaussian current noise, and a normal distributed state of charge variable corrupted by gaussian state of charge noise,
- deriving the expected value of the random capacity estimator variable,
- identifying the bias terms of the expected value of the random capacity estimator variable, and
- producing the bias compensated capacity estimator as the result of a subtraction of the bias terms from the capacity estimator.

12. The control unit according to claim 10, wherein the bias compensated capacity estimator is stored in a memory device and retrieved by the control unit from the memory storage device.

13. The control unit according to claim 10, configured for employment in a vehicle comprising an electrical energy storage device.

14. A system for estimating a capacity of an electrical energy storage device, comprising:
- an electrical current sensor configured to measure an electrical current of the electrical energy storage device, and
- processing circuitry configured to estimate a variation in state of charge of the electrical energy storage device and estimate the electrical energy storage device capacity based on an integration of the electrical current, the variation in state of charge, and a bias compensated capacity estimator including a subtraction between a capacity estimator based on a ratio between the discharge electrical current and the variation in state of charge, and at least one bias term related to being a deviation of an expected value of the capacity estimator, expressed as a random capacity estimator variable, from a true capacity value.

15. The system according to claim 14, wherein the processing circuitry includes a memory storage device configured to store the bias compensated capacity estimator.

16. The system according to claim 14, wherein the electrical energy storage device is comprised in a vehicle.

17. A vehicle comprising the system according to claim 14.

18. The vehicle according to claim 17, wherein the vehicle is an electric vehicle and the electrical energy storage device is a traction battery for providing propulsion power to the electric vehicle.

19. A computer program product comprising a computer readable medium having stored thereon computer program means for estimating a capacity of an electrical energy storage device, wherein the computer program product comprises:
- code for estimating the electrical energy storage device capacity using a bias compensated capacity estimator, integrated measured electrical current, and an estimated variation in state of charge of the electrical energy storage device, the bias compensated capacity estimator includes a subtraction between a capacity estimator based on a ratio between integrated electrical current and a variation in state of charge, and at least one bias term being a deviation of an expected value of the capacity estimator, expressed as a random capacity estimator variable, from a true capacity value.

* * * * *